United States Patent
Hwang et al.

(10) Patent No.: US 8,587,355 B2
(45) Date of Patent: Nov. 19, 2013

(54) COARSE LOCK DETECTOR AND DELAY-LOCKED LOOP INCLUDING THE SAME

(75) Inventors: Moon-Sang Hwang, Yongin (KR); Won-Jun Choe, Yongin (KR); Han-Kyu Chi, Yongin (KR); Deog-Kyoon Jeong, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/398,245

(22) Filed: Feb. 16, 2012

(65) Prior Publication Data

US 2012/0206176 A1 Aug. 16, 2012

(30) Foreign Application Priority Data

Feb. 16, 2011 (KR) .................. 10-2011-0013742

(51) Int. Cl.
*H03L 7/06* (2006.01)
(52) U.S. Cl.
USPC .......................... 327/158; 327/149

(58) Field of Classification Search
USPC .................................................. 327/149, 158
See application file for complete search history.

(56) References Cited

U.S. PATENT DOCUMENTS

| | | | |
|---|---|---|---|
| 7,084,682 B2 * | 8/2006 | Jeon et al. | 327/158 |
| 8,169,242 B2 * | 5/2012 | Abbasi et al. | 327/156 |
| 8,415,997 B2 * | 4/2013 | Li et al. | 327/156 |
| 2005/0093598 A1 * | 5/2005 | Jeon et al. | 327/158 |
| 2011/0279156 A1 * | 11/2011 | Abbasi et al. | 327/158 |
| 2012/0206176 A1 * | 8/2012 | Hwang et al. | 327/156 |
| 2012/0212264 A1 * | 8/2012 | Hwang et al. | 327/153 |

FOREIGN PATENT DOCUMENTS

| | | | |
|---|---|---|---|
| JP | 2005136964 A | * | 5/2005 |
| KR | 10-0411551 B1 | | 12/2003 |
| KR | 10-0503995 B1 | | 7/2005 |
| KR | 10-0543910 B1 | | 1/2006 |

* cited by examiner

*Primary Examiner* — Adam Houston
(74) *Attorney, Agent, or Firm* — Knobbe, Martens, Olson & Bear LLP (57) ABSTRACT

A coarse lock detector is disclosed. The course lock detector uses an initial lock range to determine course lock, and once course lock is achieved, uses a modified lock range to determine course lock.

17 Claims, 6 Drawing Sheets

COARSE LOCK DETECTOR AND DELAY-LOCKED LOOP INCLUDING THE SAME

CROSS-REFERENCE TO RELATED APPLICATIONS

This application claims priority from Korean Patent Application No. 10-2011-0013742 filed on Feb. 16, 2011 in the Korean Intellectual Property Office, the disclosure of which is incorporated herein by reference in its entirety.

BACKGROUND

1. Field

The disclosed technology relates to a coarse lock detector and a delay-locked loop including the same.

2. Description of the Related Technology

Skew reduction techniques using a phase-locked loop (PLL) or delay-locked loop (DLL) have become increasingly important as the required system bandwidth increases. The DLL has become more popular as a zero delay buffer because of its superior stability and jitter characteristics when compared to the PLL.

SUMMARY OF CERTAIN INVENTIVE ASPECTS

One inventive aspect is a coarse lock detector, which counts a number of edges of one or more of a plurality of multiphase clocks in a number of cycles of an input reference clock. The detector also outputs a lock signal in a first state if the number of edges is within a lock range, and outputs the lock signal in a second state if the number of edges is outside the lock range, where the lock range is changeable between a first lock range and a second lock range. The coarse lock detector initially sets the lock range to the first lock range, changes the state of the lock signal to the first state once the number of edges is within the first lock range, changes the lock range to the second lock range once the number of edges is within the first lock range, outputs the lock signal in the first state while the number of edges is within the second lock range, and changes the state of the lock signal to the second state and the lock range to the first lock range if the number of edges is outside the second lock range.

Another inventive aspect is a delay-locked loop, which includes a plurality of delay elements generating a plurality of multiphase clocks by delaying an input reference clock. The delay-locked loop also includes a coarse lock detector counting a number of edges of one or more of the multiphase clocks in a number of cycles of the input reference clock, outputting a lock signal in a first state if the number of edges is within a lock range, and outputting the lock signal in a second state if the number of edges is outside the lock range. The delay-locked loop also includes a dynamic phase detector enabled by the lock signal in the first state and comparing a phase of the input reference clock with that of a selected one of the multiphase clocks, and a delay controller receiving an up signal or a down signal from the coarse lock detector and the dynamic phase detector and transmitting a control signal for adjusting a delay amount of each of the delay elements to each of the delay elements, where a width of the lock range of the coarse lock detector varies according to the number of edges counted in each number of cycles of the input reference clock.

Another inventive aspect is a method of determining coarse lock of a delay-locked loop. The method includes counting a number of edges of one or more of a plurality of multiphase clocks of the delay-locked loop in a number of cycles of an input reference clock, outputting a lock signal in a first state if the number of edges is within a lock range, where the lock range is changeable between a first lock range and a second lock range, and outputting the lock signal in a second state if the number of edges is outside the lock range. The method also includes setting the lock range to the first lock range, changing the state of the lock signal to the first state once the number of edges is within the first lock range, changing the lock range to the second lock range once the number of edges is within the first lock range, outputting the lock signal in the first state while the number of edges is within the second lock range, and changing the state of the lock signal to the second state and the lock range to the first lock range if the number of edges is outside the second lock range.

DETAILED DESCRIPTION OF CERTAIN INVENTIVE EMBODIMENTS

Advantages and features and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete. In the drawings, the thickness of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section.

Embodiments described herein will be described referring to plan views and/or cross-sectional views by way of ideal schematic views. Accordingly, the exemplary views may be modified depending on manufacturing technologies and/or tolerances. Therefore, embodiments are not limited to those shown in the views, but include modifications in configuration formed on the basis of manufacturing processes. Therefore, regions exemplified in figures have schematic properties and shapes of regions shown in figures exemplify specific shapes of regions of elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
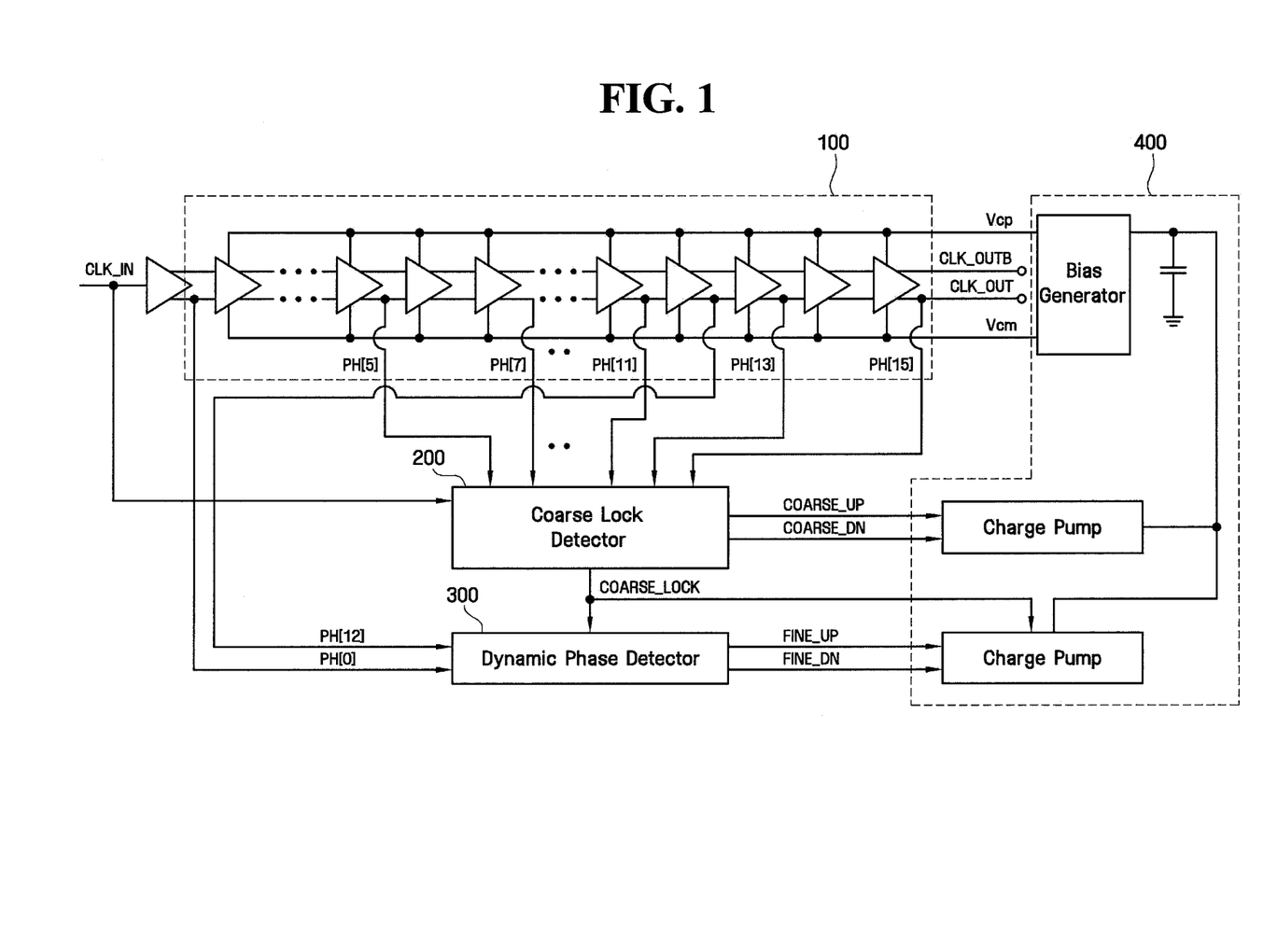
FIG. 1 is a block diagram illustrating a coarse lock detector and a delay-locked loop (DLL) including the same according to an exemplary embodiment.

Hereinafter, a coarse lock detector and a delayed-locked loop (DLL) including the same according to an exemplary embodiment is described with reference to FIG. 1. FIG. 1 is a block diagram illustrating a coarse lock detector 200 and a DLL including the same according to an exemplary embodiment.

Referring to FIG. 1, the DLL according to the current exemplary embodiment may include a plurality of delay elements 100, a coarse lock detector 200, a dynamic phase detector 300, and a delay controller 400.

The delay elements 100 may generate a plurality of multiphase clocks PH[0] through PH[15] by delaying an input reference clock CLK_IN. In the current exemplary embodiment, the delay elements 100 may be implemented as inverters. As shown in FIG. 1, the input reference clock CLK_IN is delayed by each of the inverters connected in series to generate the multiphase clocks PH[0] through PH[15].

The coarse lock detector 200 counts the number of rising edges of the multiphase clocks PH[5], PH[7], PH[11], PH[13] and PH[15] in one cycle of the input reference clock CLK_IN. When the number of rising edges falls within a lock range of the coarse lock detector 200, the coarse lock detector 200 outputs a lock signal COARSE_LOCK in a first state. On the other hand, when the number of rising edges falls outside the lock range, the coarse lock detector 200 outputs the lock signal COARSE_LOCK in a second state. Here, the first state may be the state of logic value '1' indicating that the lock signal COARSE_LOCK is high, and the second state may be the state of logic value '0' indicating that the lock signal COARSE_LOCK is low.

When the number of rising edges falls outside the lock range, the coarse lock detector 200 transmits a coarse up signal COARSE_UP including a wide up signal WIDE UP and a narrow up signal NARROW UP or a coarse down signal COARSE_DOWN including a wide down signal WIDE DOWN and a narrow down signal NARROW DOWN to a charge pump included in the delay controller 400. In so doing, the coarse lock detector 200 adjusts a delay amount of each of the delay elements 100 so that the number of rising edges falls within the lock range.

Details about the operation of the coarse lock detector 200 are disclosed in Korean Patent Publication No. 2000-0077451, which is incorporated herein in its entirety, and a redundant description thereof will be omitted.

A width of the lock range of the coarse lock detector 200 according to the current exemplary embodiment may vary according to the number of rising edges counted in each cycle of the input reference clocks CLK_IN during the N (e.g., three) cycles of the input reference clocks CLK_IN. This will be described in greater detail later when the operation of the coarse lock detector 200 according to the current exemplary embodiment is described with reference to FIG. 2.

The dynamic phase detector 300 is enabled by the lock signal COARSE_LOCK in the first state which is output from the coarse lock detector 200. The enabled dynamic phase detector 300 compares a phase of the input reference clock CLK_IN with that of any one of the multiphase clocks PH[5], PH[7], PH[11], PH[13] and PH[15] and finely tunes out a phase error between the input reference clock CLK_IN and the one of the multiphase clocks PH[5], PH[7], PH[11], PH[13] and PH[15]. That is, the dynamic phase detector 300 transmits a fine up signal FINE_UP or a fine down signal FINE_DOWN to a charge pump included in the delay controller 400. In so doing, the dynamic phase detector 300 adjusts the delay amount of each of the delay elements 100 to tune out the phase error between the input reference clock CLK_IN and any one of the multiphase clocks PH[5], PH[7], PH[11], PH[13] and PH[15].

The delay controller 400 receives the up signal COARSE_UP or FINE_UP or the down signal COARSE_DOWN or FINE_DOWN from the coarse lock detector 200 and the dynamic phase detector 300 and transmits a control signal for adjusting the delay amount of each of the delay elements 100 to each of the delay elements 100. As shown in FIG. 1, the delay controller 400 may include the charge pumps and a loop filter. Details about the operations of the dynamic phase detector 300 and the delay controller 400 are also disclosed in Korean Patent Publication No. 2000-0077451.

Figure 2:
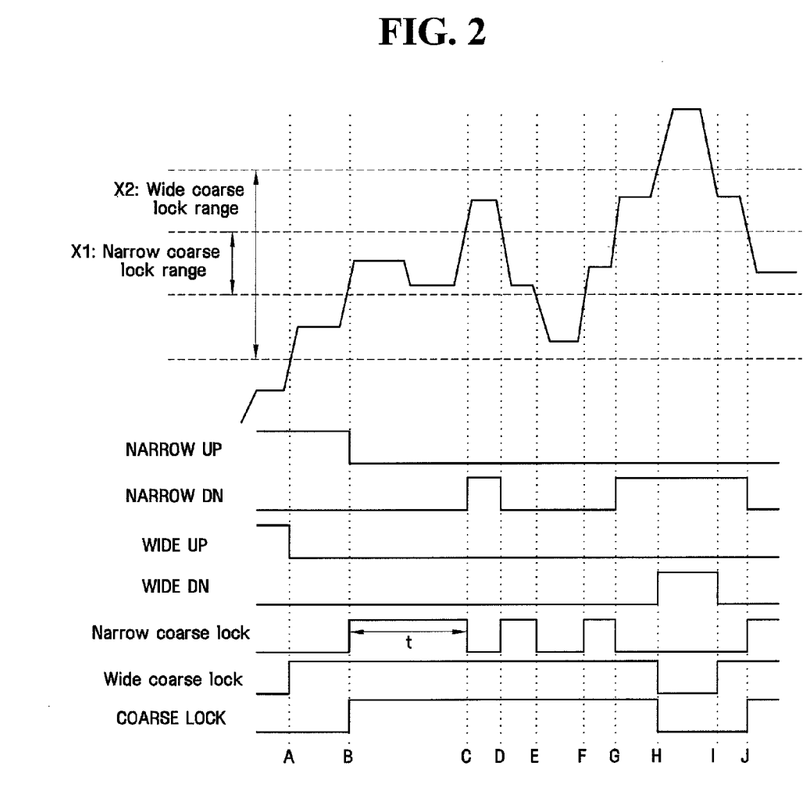
FIG. 2 is a timing diagram for explaining the operation of the coarse lock detector according to the exemplary embodiment of FIG. 1.

The operation of the coarse lock detector 200 according to the current exemplary embodiment will now be described with reference to FIGS. 1 and 2. FIG. 2 is a timing diagram for explaining the operation of the coarse lock detector 200 according to the exemplary embodiment of FIG. 1.

The coarse lock detector 200 according to the current exemplary embodiment has a first lock range X1 and a second lock range X2 which are different from each other. As illustrated in FIG. 2, the second lock range X2 is wider than the first lock range X1.

Initially, the coarse lock detector 200 sets its lock range to the first lock range X1. As described above, the coarse lock detector 200 counts the number of rising edges of the multiphase clocks PH[5], PH[7], PH[11], PH[13] and PH[15] in one cycle of the input reference clock CLK_IN. When the counted number of rising edges falls outside the second lock range X2, the coarse lock detector 200 transmits the wide up signal WIDE UP and the narrow up signal NARROW UP to the charge pump included in the delay controller 400 so that the number of rising edges is changed so as to fall within the second lock range X2 at time A.

When the number of rising edges falls within the second lock range X2, the coarse lock detector 200 transmits the narrow up signal NARROW UP to the charge pump included in the delay controller 400 so that the number of rising edges is changed to fall within the first lock range X1 at time B.

When the number of rising edges falls within the first lock range X1, since the current lock range of the coarse lock detector 200 is set to the first lock range X1, the coarse lock detector 200 outputs the lock signal COARSE_LOCK in the first state (e.g., a high state) to the dynamic phase detector 300, thereby enabling the dynamic phase detector 300. As described above, the enabled dynamic phase detector 300 transmits the fine up signal FINE_UP or the fine down signal FINE_DOWN to the charge pump included in the delay controller 400, thereby adjusting the delay amount of each of the delay elements 100 to tune out a phase error between the input reference clock CLK_IN and a selected one of the multiphase clocks PH[5], PH[7], PH[11], PH[13] and PH[15].

The width of the lock range of the coarse lock detector 200 according to the current exemplary embodiment may vary according to the number of rising edges counted in each cycle of the input reference clock CLK_IN during the N (e.g., three) cycles of the input reference clock CLK_IN. That is, when three input reference clocks CLK_IN are input for a time period of t as shown in FIG. 2 and when the number of rising edges counted in each cycle of input reference clock CLK_IN falls within the first lock range X1 as shown in FIG. 2, the coarse lock detector 200 changes its current lock range to the second lock range X2. That is, the current lock range is widened at time B to the second lock range X2.

The widened lock range provides the following advantage. When an input signal contains noise such as simultaneous switching noise (SSN), if the lock range of the coarse lock detector 200 is maintained at the narrow first lock range X1 without being increased, locking and unlocking of the coarse lock detector 200 may frequently occur (that is, the lock signal COARSE_LOCK in the first state and the lock signal COARSE_LOCK in the second state may be frequently generated in an alternating manner). Since the input signal does not actually fluctuate but is affected by external noise, such frequent locking and unlocking may adversely affect the performance of the entire DLL, thus reducing the operation stability of the DLL.

However, the width of the lock range of the coarse lock detector 200 according to the current exemplary embodiment is increased according to the number of rising edges counted in each cycle of the input reference clock CLK_IN during the N (e.g., three) cycles of the input reference clock CLK_IN, as described above. Therefore, even when the input reference clock CLK_IN slightly fluctuates due to external noise, unnecessary unlocking can be prevented. The coarse lock detector 200 which has changed its lock range to the second lock range X2 outputs the lock signal COARSE_LOCK in the first state (e.g., a high state) as long as the number of rising edges remains within the second lock range X2 during the time between C and H.

In the present discussion, the N is three. However, the present invention is not limited thereto, and the value of the N may be increased or reduced as desired.

Referring back to FIGS. 1 and 2, when the counted number of rising edges falls outside the second lock range X2, the coarse lock detector 200 according to the current exemplary embodiment changes the state of the lock signal COARSE_LOCK to the second state (e.g., a low state) and changes its lock range to the first lock range X1, that is, reduces its lock range. In addition, the coarse lock detector 200 transmits the wide down signal WIDE DOWN and the narrow down signal NARROW DOWN to the charge pump included in the delay controller 400 so that the number of rising edges falls within the first lock range X1 during the time between H and J.

When the number of rising edges falls within the first lock range X1, since the current lock range of the coarse lock detector 200 has been set again to the first lock range X1, at time J the coarse lock detector 200 outputs the lock signal COARSE_LOCK in the first state (e.g., a high state) to the dynamic phase detector 300, thereby enabling the dynamic phase detector 300. The subsequent operation of the coarse lock detector 200 is a repetition of the above-described operation.

Hereinafter, a coarse lock detector and a DLL including the same according to another exemplary embodiment is described with reference to FIGS. 3 and 4.

Figure 3:
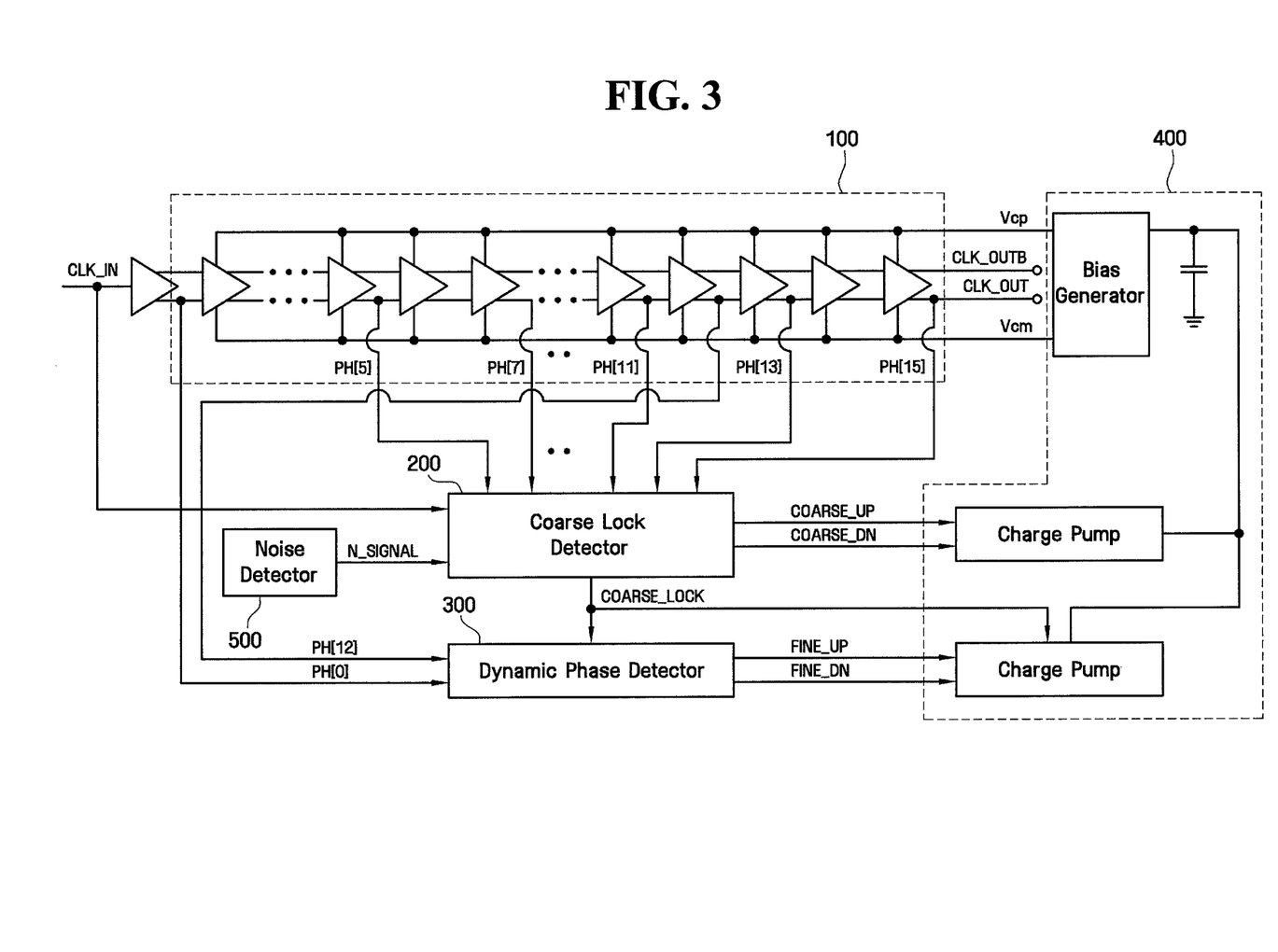
FIG. 3 is a block diagram illustrating a coarse lock detector and a DLL including the same according to another exemplary embodiment.

FIG. 3 is a block diagram illustrating a coarse lock detector 200 and a DLL including the same according to another exemplary embodiment. FIG. 4 is a diagram illustrating the configuration of the coarse lock detector 200 according to the exemplary embodiment of FIG. 3. Certain features and components of the coarse lock detector 200 and the DLL are similar to those described above. Accordingly, the following description will generally focus on the differences from the previous exemplary embodiment.

Referring to FIG. 3, the DLL according to the current exemplary embodiment may further include a noise detector 500. The noise detector 500 may detect power noise (such as SSN) in an external environment. When detecting the noise, the noise detector 500 may provide a noise detection signal N_SIGNAL to the coarse lock detector 200.

Figure 4:
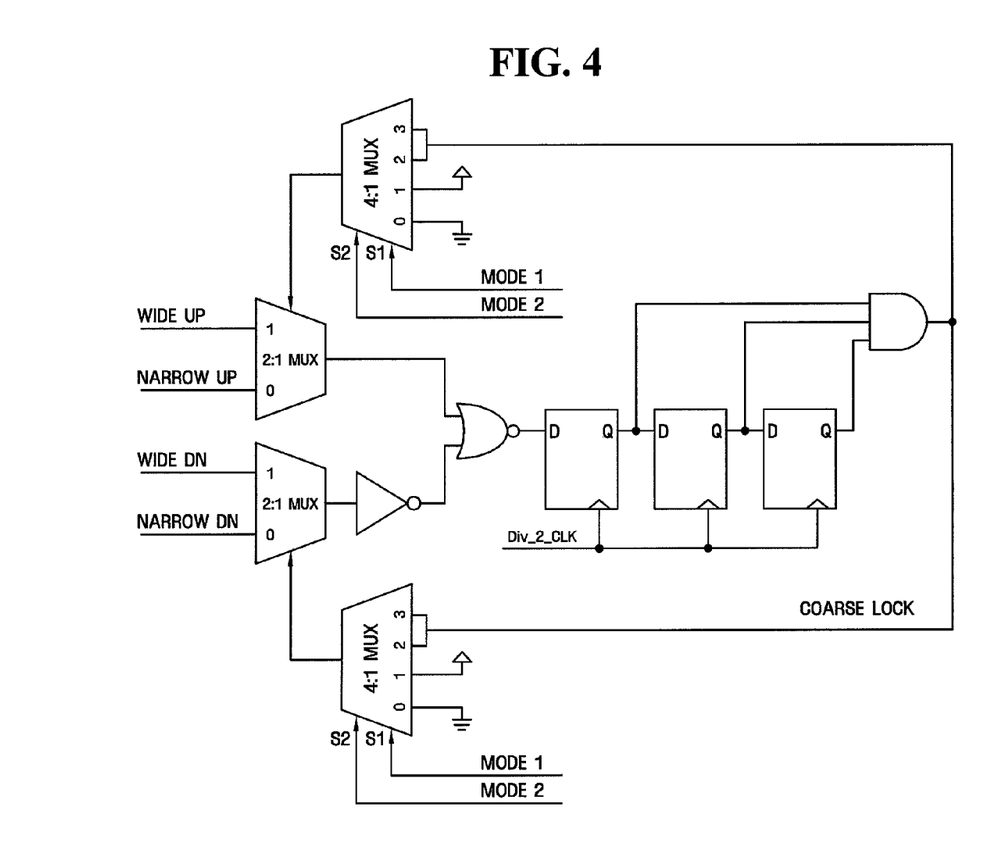
FIG. 4 is a diagram illustrating the configuration of the coarse lock detector according to the exemplary embodiment of FIG. 3.

Referring to FIG. 4, the coarse lock detector 200 according to the current exemplary embodiment includes a plurality of multiplexers, logic elements, and a flip-flop. The coarse lock detector 200 operates in a first mode S1 when not receiving the noise detection signal N_SIGNAL from the noise detector 500 and operates in a second mode S2 when receiving the noise detection signal N_SIGNAL from the noise detector 500. The operation of the coarse lock detector 200 in the second mode S2 is similar or identical to the above-described operation of the coarse lock detector 200 according to the previous exemplary embodiment. The operation of the coarse lock detector 200 in the second mode S2 is described in greater detail with reference to FIG. 5.

As shown in FIG. 4, the coarse lock detector 200 according to the current exemplary embodiment is includes the multiplexers, the logic elements, and the flip-flop. However, the present invention is not limited to the configuration of FIG. 4. The configuration of the coarse lock detector 200 according to the current exemplary embodiment can be changed in any way desired.

Figure 5:
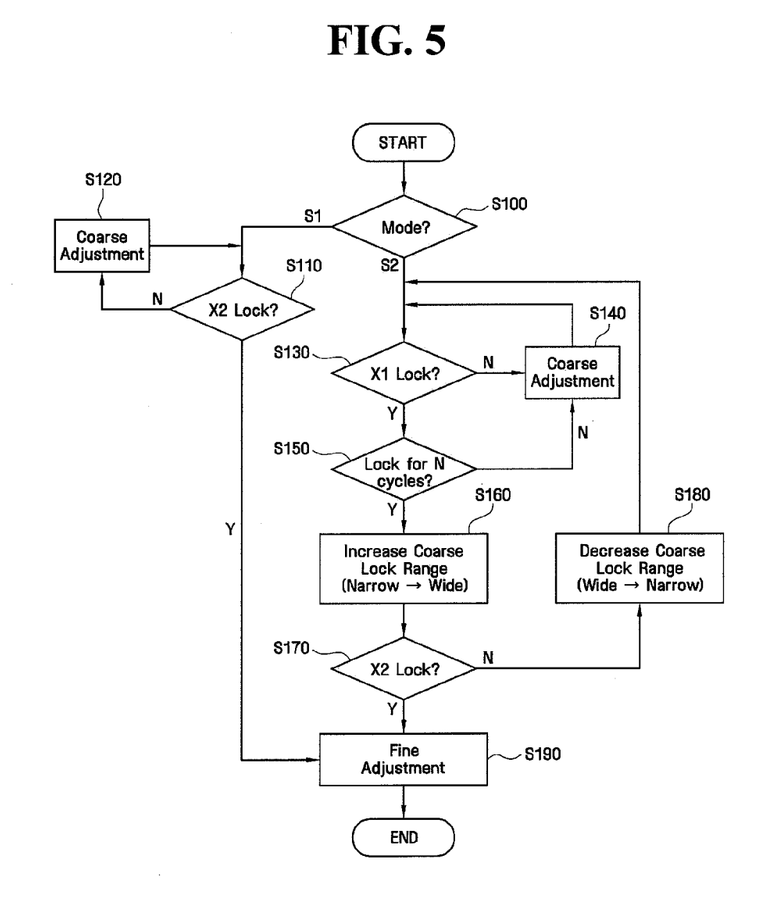
FIG. 5 is a flowchart illustrating the operations of the coarse lock detector and the DLL including the same according to the exemplary embodiment of FIG. 3.

The operation of the coarse lock detector 200 according to the current exemplary embodiment is described with reference to FIGS. 2, 3 and 5. FIG. 5 is a flowchart illustrating functionality of the coarse lock detector 200 and the DLL including the same according to the exemplary embodiment of FIG. 3.

Referring to FIGS. 2, 3 and 5, it is determined whether the coarse lock detector 200 is in the first mode S1 or the second mode S2 (operation S100). As described above, the first mode S1 indicates a state in which the coarse lock detector 200 has not received the noise detection signal N_SIGNAL from the noise detector 500. In the first mode S1, noise such as SSN does not exist or is low in an external environment. Even when some noise exists, it may not greatly affect the locking performance of the coarse lock detector 200. Here, the coarse lock detector 200 according to the current exemplary embodiment fixes and sets its lock range to the second lock range X2 and determines whether the number of rising edges falls within the second lock range X2.

When the number of rising edges falls outside the second lock range X2, the coarse lock detector 200 transmits the coarse up signal COARSE_UP consisting of the wide up signal WIDE UP or the coarse down signal COARSE_DOWN consisting of the wide down signal WIDE DOWN to the charge pump included in the delay controller 400 so that the number of rising edges is changed to fall within the second lock range X2 (operation S120). When the number of rising edges falls within the second lock range X2 through the above process, the coarse lock detector 200 transmits the lock signal COARSE_LOCK in the first state (e.g., a high state) to the dynamic phase detector 300, thereby enabling the dynamic phase detector 300 so that the dynamic phase detector 300 can perform a tune-out operation (operation S190).

On the other hand, when the coarse lock detector 200 is in the second mode S2, that is, when the noise detection signal N_SIGNAL has been transmitted from the noise detector 500 to the coarse lock detector 200, significant noise, such as SSN, exists in the external environment. Accordingly, the lock range of the coarse lock detector 200 needs to be changed. In this case, the coarse lock detector 200 operates in the same way as the coarse lock detector 200 according to the previous exemplary embodiment.

Specifically, the coarse lock detector 200 initially sets its lock range to the first lock range X1. When the counted number of rising edges falls outside the second lock range X2, the coarse lock detector 200 transmits the coarse up signal COARSE_UP consisting of the wide up signal WIDE UP and the narrow up signal NARROW UP or the coarse down signal COARSE_DOWN consisting of the wide down signal WIDE DOWN and the narrow down signal NARROW DOWN to the charge pump included in the delay controller 400 so that the number of rising edges is changed to fall within the first lock range X1 (operations S130 and S140).

When the number of rising edges falls within the first lock range X1, the coarse lock detector 200 counts the number of rising edges in each cycle of the input reference clock CLK_IN during the N (e.g., three) cycles of the input reference clock CLK_IN. When all of the numbers of rising edges counted in the N cycles fall within the first lock range X1, the coarse lock detector 200 changes its lock range to the second lock range X2 (operations S130, S150 and S160).

When the counted number of rising edges falls outside the second lock range X2 as time passes, the coarse lock detector 200 changes the state of the lock signal COARSE_LOCK to the second state (e.g., a low state) and changes its lock range to the first lock range X1, that is, it reduces its lock range (operations S170 and S180). On the contrary, when the counted number of rising edges still falls within the second lock range X2 even as time passes, the dynamic phase detector 300 performs a tune-out operation (operations S170 and S190), which has already been described above in detail and thus will not be described again.

In the coarse lock detector 200 and the DLL including the same according to the current exemplary embodiment, the noise detector 500 is additionally included. Therefore, the coarse lock detector 200 can operate in different modes when noise exists in the external environment and when significant noise does not exist. As a result, the coarse lock detector 200 and the DLL including the same can operate with increased efficiency.

Hereinafter, functionality of a coarse lock detector and a DLL including the same according to exemplary embodiments are described with reference to FIG. 6.

Figure 6:
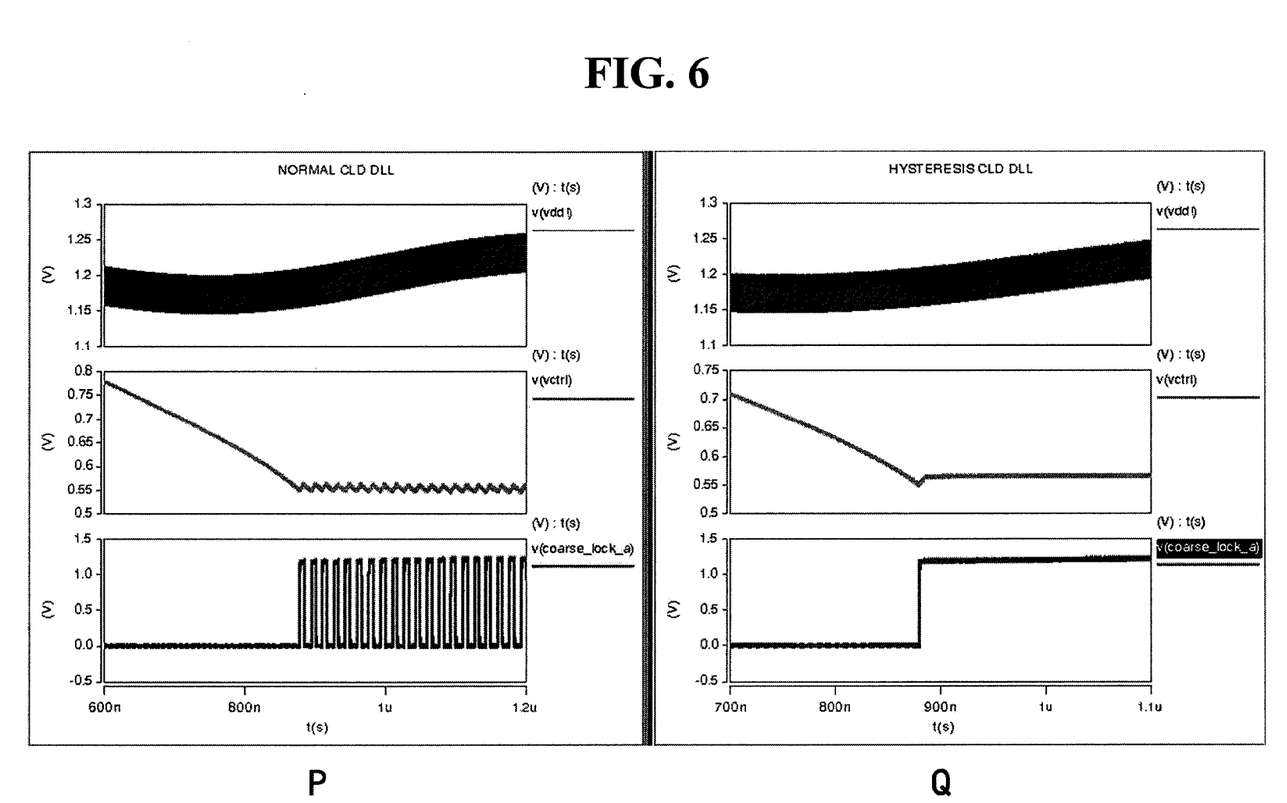
FIG. 6 illustrates graphs for explaining the effects of a coarse lock detector and a DLL including the same according to various exemplary embodiments.

Referring to FIG. 6, simulation results obtained when a coarse lock detector, whose lock range remains unchanged is applied to a DLL used in a graphics double data rate 3 (GDDR3) memory interface system are shown in section P, and simulation results obtained when a coarse lock detector, whose lock range is changed according to exemplary embodiments, is applied to the DLL used in the GDDR3 memory interface system are shown in section Q.

In FIG. 6, a graph at the top of each section P or Q illustrates an input supply voltage in which external noise such as SSN exists, a graph in the middle illustrates a control voltage of a DLL, and a graph at the bottom illustrates an output of a coarse lock detector.

As apparent from FIG. 6, an output of the coarse lock detector whose lock range remains unchanged fails to maintain a locked state due to external noise (such as SSN) and thus fluctuates (see the graph at the bottom of section P in FIG. 6). Here, the control voltage also fluctuates widely (see the graph in the middle of section P in FIG. 6). On the other hand, an output of the coarse lock detector whose lock range changes like the coarse lock detector according to the exemplary embodiments of the present invention maintains the locked state despite external noise (such as SSN) (see the graph at the bottom of section Q in FIG. 6), and the control signal is also stable (see the graph in the middle of section Q in FIG. 6).

While various features and aspects have been particularly shown and described with reference to exemplary embodiments, it will be understood by those of ordinary skill in the art that various changes in form and details may be made therein without departing from the spirit and scope of the present invention. It is therefore desired that the present embodiments be considered in all respects as illustrative and not restrictive.

What is claimed is:

1. A coarse lock detector configured to count a number of edges of one or more of a plurality of multiphase clocks in one cycle of an input reference clock, to output a lock signal in a first state if the number of edges is within a lock range, or to output the lock signal in a second state if the number of edges is outside the lock range, wherein the lock range is changeable between a first lock range and a second lock range, and the coarse lock detector initially sets the lock range to the first lock range, changes the state of the lock signal to the first state once the number of edges is within the first lock range, changes the lock range to the second lock range once the number of edges in N cycles of the input reference clock is within the first lock range, outputs the lock signal in the first state while the number of edges is within the second lock range, and changes the state of the lock signal to the second state and the lock range to the first lock range if the number of edges is outside the second lock range.

2. The coarse lock detector of claim 1, wherein the second lock range is different from the first lock range.

3. The coarse lock detector of claim 2, wherein the second lock range is wider than the first lock range.

4. The coarse lock detector of claim 1, wherein N is three.

5. A delay-locked loop comprising:
a plurality of delay elements configured to generate a plurality of multiphase clocks by delaying an input reference clock;
a coarse lock detector configured to count a number of edges of one or more of the multiphase clocks in one cycles of the input reference clock, to output a lock signal in a first state if the number of edges is within a lock range, or to output the lock signal in a second state if the number of edges is outside the lock range;
a dynamic phase detector enabled by the lock signal in the first state and is configured to compare a phase of the input reference clock with that of a selected one of the multiphase clocks; and
a delay controller configured to receive an up signal or a down signal from the coarse lock detector and the dynamic phase detector and to transmit a control signal for adjusting a delay amount of each of the delay elements to each of the delay elements, wherein a width of the lock range of the coarse lock detector varies according to the number of edges counted in each of N cycles of the input reference clock.

6. The delay-locked loop of claim 5, wherein the lock range is changeable between a first lock range and a second lock range which is different from the first lock range, and the coarse lock detector initially sets the lock range to the first lock range, changes a state of the lock signal to the first state if the number of edges is within the first lock range, changes the lock range to the second lock range if the number of edges counted in each of N cycles of the input reference clock is within the first lock range, outputs the lock signal in the first state while the number of edges is within the second lock range, and changes the state of the lock signal to the second state and the lock range to the first lock range if the number of edges is outside the second lock range.

7. The delay-locked loop of claim 6, wherein the second lock range is wider than the first lock range.

8. The delay-locked loop of claim 5, wherein N is three.

9. The delay-locked loop of claim 5, further comprising a noise detector configured to detect noise and to transmit a noise detection signal to the coarse lock detector, wherein the width of the lock range of the coarse lock detector varies according to the number of edges counted in each of N cycles of the input reference clock only if the coarse lock detector receives the noise detection signal from the noise detector.

10. The delay-locked loop of claim 9, wherein the noise comprises simultaneous switching noise.

11. The delay-locked loop of claim 5, wherein the delay elements are inverters.

12. A method of determining coarse lock of a coarse lock detector, which is configured to count a number of edges of one or more of a plurality of multiphase clocks of the delay-locked loop in one cycles of an input reference clock to output a lock signal in a first state if the number of edges is within a lock range, wherein the lock range is changeable between a first lock range and a second lock range, or to output the lock signal in a second state if the number of edges is outside the lock range, the method comprising:
   setting the lock range to the first lock range;
   changing the state of the lock signal to the first state once the number of edges is within the first lock range;
   changing the lock range to the second lock range once the number of edges in N cycles of the input reference clock is within the first lock range;
   outputting the lock signal in the first state while the number of edges is within the second lock range; and
   changing the state of the lock signal to the second state and the lock range to the first lock range if the number of edges is outside the second lock range.

13. The method of claim 12, wherein the second lock range is different from the first lock range.

14. The method of claim 13, wherein the second lock range is wider than the first lock range.

15. The method of claim 12, wherein N is three.

16. The coarse lock detector of claim 1, wherein the coarse lock detector receives an input reference clock and one or more of a plurality of multiphase clocks.

17. The coarse lock detector of claim 5, wherein the coarse lock detector receives an input reference clock and one or more of a plurality of multiphase clocks, and wherein the delay controller comprises a bias generator and multiple charge pumps.

* * * * *